United States Patent
Bhatia et al.

(10) Patent No.: US 7,899,096 B1
(45) Date of Patent: Mar. 1, 2011

(54) METHODS AND CIRCUITS FOR CONTROLLING DRIVE MECHANISMS

(75) Inventors: Vikram Bhatia, Painted Post, NY (US); David Gustave Ehrenberg, Painted Post, NY (US); Dragan Pikula, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/610,060

(22) Filed: Oct. 30, 2009

(51) Int. Cl.
*H01S 3/13* (2006.01)
*G02F 2/02* (2006.01)

(52) U.S. Cl. .............................. 372/29.011; 372/29.01; 372/29.02; 359/326

(58) Field of Classification Search ............. 372/29.01, 372/29.011, 29.014, 29.02; 359/326, 328
See application file for complete search history.

(56) References Cited

U.S. PATENT DOCUMENTS

| | | | |
|---|---|---|---|
| 6,727,635 B2 | 4/2004 | Okamoto et al. | 310/316.01 |
| 7,043,118 B2* | 5/2006 | Arimoto et al. | 385/31 |
| 7,511,880 B2* | 3/2009 | Mori et al. | 359/328 |
| 7,729,397 B1* | 6/2010 | Gollier et al. | 372/29.021 |
| 2002/0033322 A1* | 3/2002 | Nakano et al. | 200/237 |
| 2007/0091411 A1* | 4/2007 | Mori et al. | 359/239 |
| 2008/0019702 A1* | 1/2008 | Shibatani et al. | 398/182 |
| 2008/0212108 A1* | 9/2008 | Shibatani | 356/614 |
| 2008/0240181 A1* | 10/2008 | Shibatani | 372/29.014 |
| 2008/0243272 A1* | 10/2008 | Shibatani | 700/59 |
| 2009/0032713 A1* | 2/2009 | Bhatia | 250/363.01 |
| 2009/0059976 A1* | 3/2009 | Shibatani | 372/29.01 |
| 2009/0251804 A1* | 10/2009 | Shibatani | 359/822 |

OTHER PUBLICATIONS

Y. Ozeki, et al "Minature Multiple-axes adaptive optics unit employing SIDMs and its application to an efficient green laser module", Konica Minolta Technology Report vol. 6, 2009.
Y. Bhatia, "High efficiency green lasers for mobile projectors", LAD2-2, Invited Paper at IDS (International Displays Workshop) 17, Sapporo, Japan, Dec. 2007.
M. H. Hu, et al "High-Power high-modulation-speed 1060-nm DBR lasers for green-light emission", IEEE Photonic Tech. Lett. pp. 606618, vol. 18, No. 4, 2006.

* cited by examiner

*Primary Examiner*—Minsun Harvey
*Assistant Examiner*—Phillip Nguyen
(74) *Attorney, Agent, or Firm*—Gregory V. Bean

(57) ABSTRACT

A method for aligning an optical package includes applying a dither waveform and an advancement waveform to a drive mechanism. The optical package includes a semiconductor laser operable to emit an output beam with a first wavelength, a wavelength conversion device operable to convert the output beam to a second wavelength, adaptive optics configured to optically couple the output beam into a waveguide portion of an input facet of the wavelength conversion device, and a drive mechanism coupled to the adaptive optics and configured to adjust a position of the output beam. The dither waveform oscillates the adaptive optics back and forth in first and second directions to oscillate the output beam on the input facet. The advancement waveform advances the adaptive optics in an adjustment direction. Rising and falling edge times of the dither waveform are greater than rising and falling edge times of the advancement waveform.

19 Claims, 6 Drawing Sheets

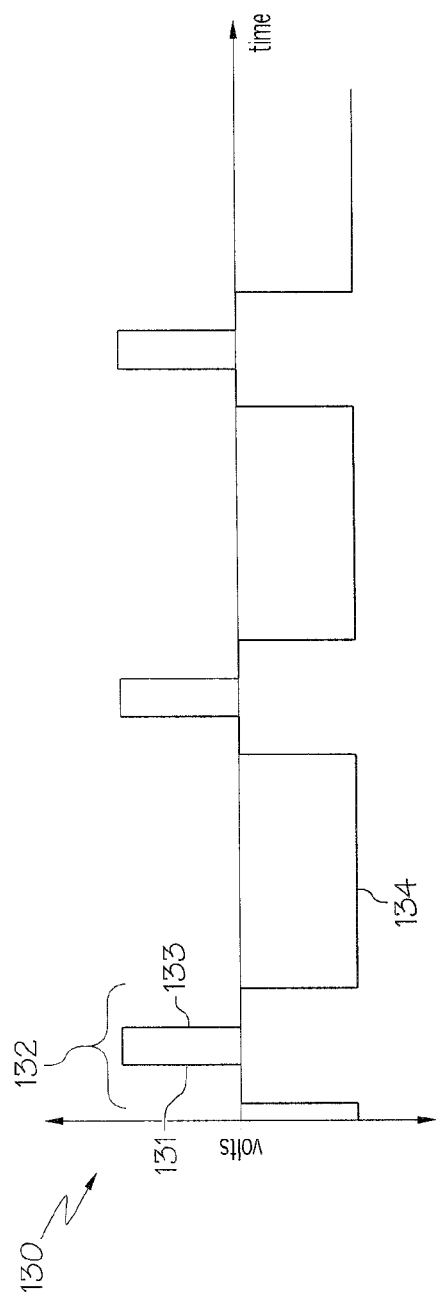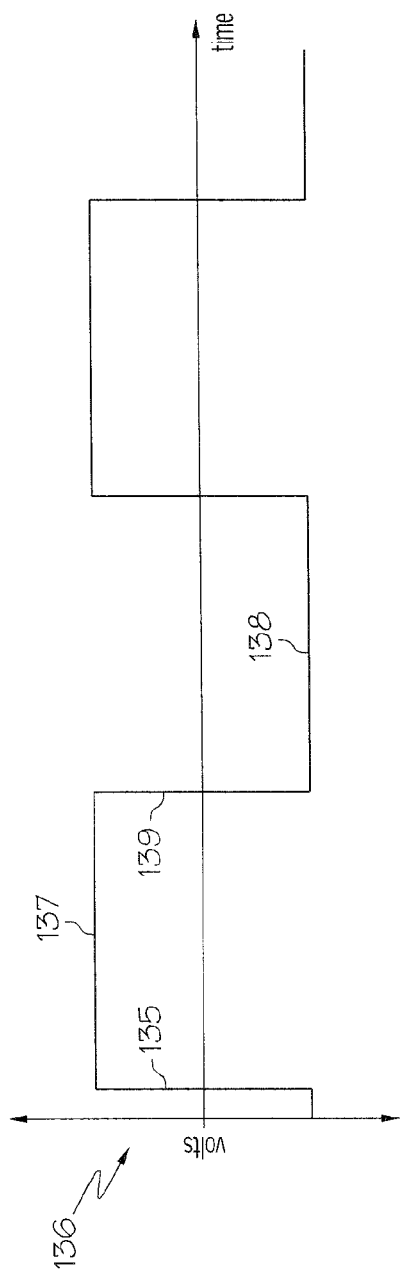

METHODS AND CIRCUITS FOR CONTROLLING DRIVE MECHANISMS

BACKGROUND OF THE INVENTION

Field of the Invention

Embodiments of the present disclosure generally relate to the alignment of components within a mechanical assembly, such as an optical package. More specifically, embodiments relate to optical packages and the alignment of adaptive optics therein such that an output beam of a laser is positioned upon a waveguide input of a wavelength conversion device.

BRIEF SUMMARY OF THE INVENTION

The present inventors have recognized that in many applications, there is a need for extremely accurate coupling between components of an assembly. For example, accurate optical coupling is required in the assembly of component parts of an optical package, such as a frequency doubled green laser apparatus. In such an application, a wavelength conversion device comprising a nonlinear optical crystal, such as a Mg-0 doped periodically poled lithium niobate (PPLN) crystal, is used to convert the infrared light emission of a laser into visible green light. Both the diode laser and nonlinear optical crystal use single mode waveguide structures to confine and guide the light energy. In such a green laser application, there is a need for the components of the assembly to be maintained in rigid alignment such that the output beam of the laser is precisely aligned with the very small waveguide input that is located on an input facet of the waveguide crystal. Waveguide optical mode field diameters of typical second harmonic generating (SHG) crystals, such PPLN crystals, can be in the range of a few microns. As a result, it can be very challenging to properly align and focus the output beam from the laser diode with the waveguide of the wavelength conversion device, particularly during assembly of the optical package.

Tolerances on the alignment of the laser and nonlinear crystal waveguide may be between 300 nm and 500 nm (for 5% degradation in coupling) in the plane perpendicular to the optical axis. The tolerance along the direction of the optical axis may be significantly looser, between about 3 µm and 4 µm. Therefore, the slightest misalignment between the laser output beam and the waveguide input may result in reduced coupling of the infrared energy and result in a loss of green output power. For example, a 0.3 µm shift of the wavelength conversion device or the output of the laser diode due to thermal expansion may cause a green laser output power to be reduced by 10% from the value at peak coupling.

In an active alignment approach, an adjustable active component is used in conjunction with a closed loop feedback system to insure that the infrared energy from the laser is accurately aligned with the small input of the crystal waveguide. Because of this adjustability, the requirements for alignment of the various component parts of the device can be relaxed by an additional order of magnitude or so, allowing the components to be assembled to much more relaxed positional tolerances, on the order of tens or hundreds of microns. The active component or components may also be used to accommodate alignment changes during the life and operation of the laser.

A smooth impact drive mechanism (SIDM) is one particular type of actuator that may be utilized to align components within an optical package. A SIDM is a piezo-electric based ultrasonic linear actuator that may be used to advance the position an optical component within the optical package to adjust the position of the output beam on the input facet of the wavelength conversion device. The drive mechanism may also be controlled to dither an optical component back and forth about an average position to determine an adjustment direction. However, current SIDM control methods undesirably move the optical component during the dither operation such that the optical component is actually advanced and not moved back and forth about an average position, resulting in slower closed loop control and overworking of the SIDM.

In one embodiment, a method for aligning an optical package includes applying a dither waveform and an advancement waveform to a drive mechanism. The optical package may include a semiconductor laser operable to emit an output beam with a first wavelength, a wavelength conversion device operable to convert the output beam to a second wavelength, adaptive optics configured to optically couple the output beam into a waveguide portion of an input facet of the wavelength conversion device, and a drive mechanism coupled to the adaptive optics and configured to adjust a position of the output beam on the input facet. The dither waveform is applied to the drive mechanism to perform a dither operation during which the drive mechanism oscillates the adaptive optics back and forth in first and second directions to oscillate a position of the output beam on the input facet. The advancement waveform is applied to the drive mechanism to perform an advancement operation during which the drive mechanism advances the adaptive optics in an adjustment direction. A polarity of the advancement waveform corresponds with the adjustment direction and a rising edge time and a falling edge time of the dither waveform is greater than a rising edge time and a falling edge time of the advancement waveform.

In another embodiment, a control circuit for aligning an optical package is operable to apply a dither waveform and an advancement waveform to a drive mechanism within the optical package. The optical package may further include a laser operable to emit an output beam with a first wavelength, a wavelength conversion device operable to convert the output beam to a second wavelength, and adaptive optics configured to optically couple the output beam into a waveguide portion of an input facet of the wavelength conversion device. The drive mechanism may be coupled to the adaptive optics and configured to adjust a position of the output beam on the input facet. The dither waveform is applied to the drive mechanism to perform a dither operation during which the drive mechanism oscillates the adaptive optics back and forth in first and second directions to oscillate a position of the output beam on the input facet. The advancement waveform is applied to the drive mechanism to perform an advancement operation during which the drive mechanism advances the adaptive optics in an adjustment direction. A polarity of the advancement waveform corresponds with the adjustment direction and a rising edge time and a falling edge time of the dither waveform is greater than a rising edge time and a falling edge time of the advancement waveform.

In yet another embodiment, a method for controlling a drive mechanism coupled to an object includes applying a dither waveform to the drive mechanism to perform a dither operation during which the drive mechanism oscillates the object back and forth in first and second directions to oscillate a position of the object about an average position. The method further includes applying an advancement waveform to the drive mechanism to perform an advancement operation during which the drive mechanism advances the object in an adjustment direction. A polarity of the advancement waveform corresponds with the adjustment direction and a rising edge time and a falling edge time of the dither waveform is greater than a rising edge time and a falling edge time of the advancement waveform.

BRIEF DESCRIPTION OF THE SEVERAL VIEWS OF THE DRAWINGS

The following detailed description of specific embodiments disclosed herein can be best understood when read in conjunction with the following drawings, where like structure is indicated with like reference numerals and in which:

FIG. 3 depicts an exemplary advancement waveform according to one or more embodiments;

FIG. 4 depicts a conventional dither waveform;

DETAILED DESCRIPTION

Figure 1:
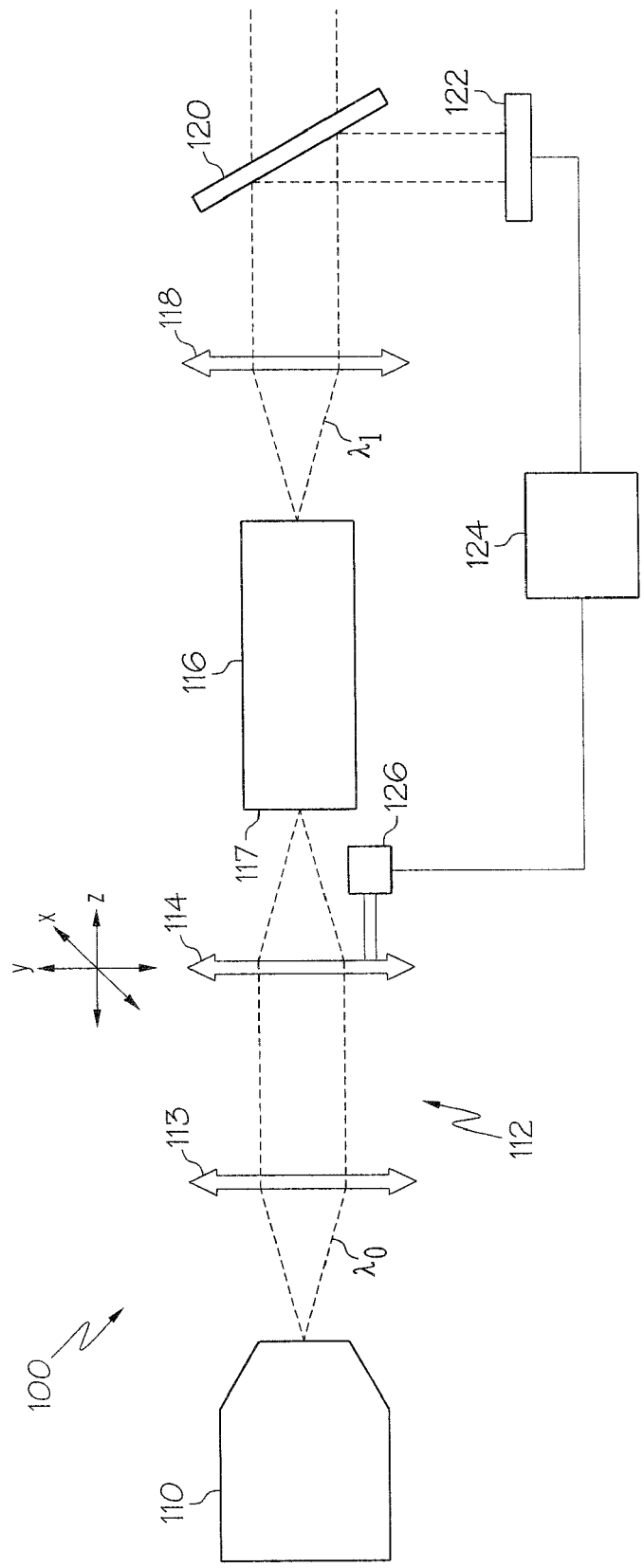
FIG. 1 depicts a schematic illustration of an exemplary optical package according to one or more embodiments.

Reference will now be made in detail to various embodiments for aligning an object such as an optical package, examples of which are illustrated in the accompanying drawings. Whenever possible, the same reference numerals will be used throughout the drawings to refer to the same or like parts.

Generally, the circuits and methods described herein may control one or more drive mechanisms, such as smooth impact drive mechanisms (SIDM), to align an output beam emitted by a semiconductor laser into a waveguide portion of a wavelength conversion device. The drive mechanism or mechanisms may be coupled to adaptive optics configured to be translated to adjust a position of the output beam on an input facet of the wavelength conversion device. A dither operation may be performed to oscillate a position of the adaptive optics about an average position to determine an adjustment direction by applying a dither waveform to the drive mechanism. The dither waveform has slow rising and falling edge times such that the adaptive optics do not "slip," thereby resulting in substantially no net motion during the dither operation. Although embodiments described herein are described in the context of aligning an output beam by adjusting a position of adaptive optics in a green laser optical package, embodiments are not limited thereto. Various embodiments of the systems and methods for aligning an optical package will be described in more detail herein below.

Referring to FIG. 1, an exemplary optical package 100 is illustrated. Generally, the optical package 110 may comprise a laser 110, adaptive optics 112, which may comprise one or more lenses or mirrors (e.g., first focusing lens 113 and/or second focusing lens 114), and a drive mechanism coupled to the adaptive optics 111. The optical package 100 may be particularly useful in generating a variety of shorter wavelength laser beams from a variety of longer wavelength semiconductor lasers and can be used, for example, as a visible laser source in a laser projection system.

The laser 110 may comprise one or more lasers or coherent light sources, such as distributed feedback (DFB) lasers, distributed Bragg reflector (DBR) lasers, vertical cavity surface-emitting lasers (VCSEL), or vertical external cavity surface-emitting lasers (VECSEL), for example. The wavelength conversion device 116, such as a second harmonic generating (SHG) crystal or a higher harmonic generating crystal, may be used to frequency-double an output beam emitted by the laser 110 having a native wavelength $\lambda_o$ in the infrared or near-infrared band into a converted wavelength $\lambda_1$. For example, a SHG crystal, such as a MgO-doped periodically poled lithium niobate (PPLN) crystal, may be used to generate green light by converting a wavelength of a 1060 nm DBR or DFB laser to 530 nm.

Figure 2:
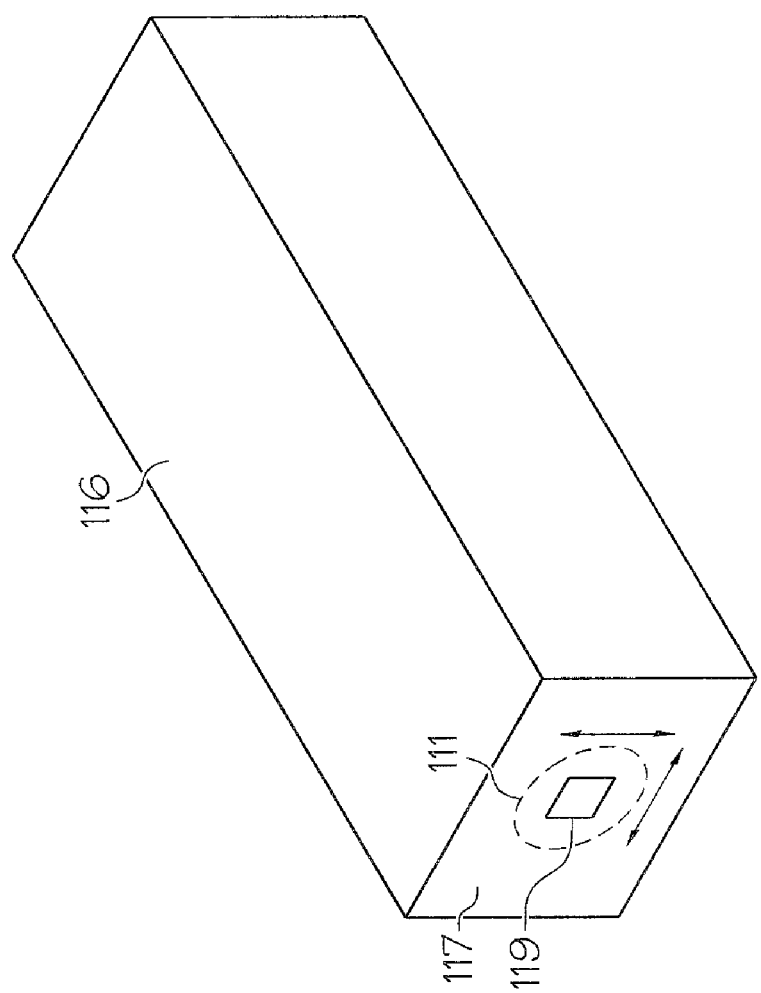
FIG. 2 depicts a schematic illustration of a perspective view of an exemplary wavelength conversion device according to one or more embodiments.

As illustrated in FIGS. 1 and 2, the wavelength conversion device 116 comprises an input facet 117 in which an output beam is directed by the adaptive optics 112. In the illustrated embodiment, a first lens 113 of the adaptive optics 112 collimates the divergent output beam and a second lens 114 focuses the output beam to form a beam spot 111 on the input facet 117. As described in more detail below, the adaptive optics 112 may be moved via one or more drive mechanisms 126 to align and focus the beam spot 111 onto a waveguide portion 119 of the wavelength conversion device 116 such that optimum green output power may be achieved. For example, the adaptive optics 112 may be moved in both the x and y directions to translate the position of the beam spot 111 on the input facet 117 as well as in the z direction to focus the beam spot 111 to a large or smaller point on the input facet 117. Although FIG. 1 illustrates the adaptive optics 112 as two lenses with one being adjustable by the drive mechanism 126, it may also be configured as one or more adjustable lenses and mirrors.

The converted output beam having a wavelength may exit the wavelength conversion device 116 and be collimated by collimating lens 118. The converted output beam may then pass through beam splitter 120 in which a portion of the beam is directed toward a photodiode detector 122. The photodiode detector 122 is operable to detect a power of the converted light exiting the wavelength conversion device 116 and provide a signal to a package controller 124 accordingly. The package controller 124, which is electrically coupled to the drive mechanism 126, may be configured to receive the signal from the photodiode detector 112 and provide one or more waveforms to the drive mechanism 126. As described in detail below, the drive mechanism 126 may translate the adaptive optics in accordance with the waveforms provided by the package controller 124. The package controller 124 of the closed loop control may be used to compensate for temperature changes, mechanical displacement, and alignment of components within the optical package during assembly to ensure that a maximum level of green light is emitted from the wavelength conversion device 116.

In the illustrated embodiment of FIG. 1, the drive mechanism 126 is coupled to a single focusing lens 114 of the adaptive optics 112. The drive mechanism 126 is capable of translating the focusing lens 114 in three directions along the x, y and z axes. The drive mechanism 126 package may internally comprise one or more SIDM actuators as described in detail below. Each SIDM actuator is operable to translate an object in a particular direction along an axis of travel. In the illustrated embodiment, a translation along the z-axis focuses the output beam onto the input facet 117 of the wavelength conversion device 116 while a translation in the x and y axes moves the position of the beam spot 111 as illustrated in FIG. 3.

In other embodiments, the drive mechanism 126 may be configured to translate the focusing lens 114 along the x and y axes and not the z axis. Additionally, the optical package may comprise two or more drive mechanisms. For example, one drive mechanism having two SIDMs may be mechanically coupled to first focusing lens 113 and operable to translate said lens 113 in two directions, e.g., along the x and y axes. A second drive mechanism having one SIDM may then be coupled to the second focusing lens 114 and configured to translate said lens 114 in one direction, e.g., along the z-axis. Other configurations are also possible, such as three lenses or mirrors and three drive mechanisms, or one lens and one drive mechanism, for example.

The drive mechanism 126 may include one or SIDM devices within its package. A SIDM may generally comprise a base, a piezo element, and a driving rod that frictionally supports a moving object, such as a lens in an optical package application. The expanding and contracting piezo element causes a "stick/slip" motion of the object. During an advancement operation, the SIDM advances the object by expanding and contracting the piezo element in accordance with a waveform having a given voltage, frequency and duty cycle. During a period of slow piezo element expansion or contraction, the object "sticks" to the driving rod and advances. During a period of rapid piezo element expansion or contraction, the object "slips" as the driving rod quickly moves underneath the object. The "stick/slip" cycle (i.e., the "step") is repeated until a desired position of the object is achieved.

An exemplary advancement waveform 130 is illustrated in FIG. 3. The voltage pulses are applied across a first and second lead of the SIDM. The relatively short, positive voltage pulses 132 rapidly expand (or contract) the piezo element such that driving rod is quickly moved in a first direction. The object cannot follow the moving rod and "slips" by inertia. Conversely, during relatively long negative or low voltage regions 134, the piezo element contracts (or expands) slowly which causes the driving rod to carry object by friction in a second direction. The advancement waveform 130 may have a frequency of 300-400 kHz and a 30% duty cycle with fast rise and fall times of 150 ns to 200 ns. The 30% duty cycle is such that the piezo element may have time to fully expand or contract during a "stick" operation prior to a "slip" operation. The fast rise and fall times enable the piezo element to quickly react to the voltage pulse. To reverse the direction of advancement, the polarity of the advancement waveform 130 may be switched such that the object may be advanced in a first direction. An "H-bridge" circuit may be utilized to generate the advancement waveform 130 such as the circuit schematically illustrated in FIG. 6. Although the circuit of FIG. 6 uses continuous drivers, other semiconductor components capable of tri-stating its output may be used, such as discrete transistors with properly sequenced gate (or base) drives, for example.

The SIDM of the drive mechanism may also be controlled to perform a dither operation in which the object is dithered or "rocked" about an average position with little or no net movement. Limited "slip" motion is desired in this operation. The dither operation may be used in conjunction with a closed loop control (such as the closed loop control illustrated in FIG. 1) to determine an adjustment direction that should be undertaken during the advancement operation. For example, referring to FIG. 1, the drive mechanism may be controlled to oscillate the second focusing lens 114 in a direction (e.g., along the x-axis) about an average position. The output of light exiting the wavelength conversion device 116 may be measured by the photodiode detector 122 as the second lens 114 is translated. If one direction yields an increase power measurement, then this direction corresponds to an adjustment direction in which the second lens 114 should be moved during the advancement operation. For example, if a positive direction along the x-axis provides for an increased power measurement, the second lens 114 should be moved along the x-axis in positive direction during the advancement operation.

A conventional dither waveform 136 is illustrated in FIG. 4. The voltage pulses may occur at a frequency that is less than the frequency of the advancement waveform, such as about 300 Hz, for example. The dither waveform 136 may have a duty cycle of about 50% such that the object may evenly move in both directions. As described above, it is desirable that no slippage of the object occurs during the dither operation such that the object experiences substantially zero net motion. Advancing motion during the dither operation may be undesirable because it may significantly slow the speed of the closed loop control and unnecessarily move the object as it will cause an increased number of steps during the advancement operation to achieve the desired location.

The inventors have found that despite low frequency pulses, the dither waveform 136 of FIG. 4 causes the object (e.g., second lens 114 of the adaptive optics) to experience small "stick/slip" motions rather than following driving rod as the piezo material expands and contracts. In the context of the optical package 100 of FIG. 1, the closed loop control may instruct the drive mechanism to make many additional steps because the adaptive optics "slip" in response to the conventional dither waveform 136, and may not be able to react quickly enough to compensate for fast temperature changes. Even if the dither waveform comprises a low basic frequency, fast rising and falling edges 135, 139 contain high frequency content that may cause a large acceleration of the driving rod and second lens coupled thereto. The acceleration of the driving rod resulting from the high frequency content overcomes the friction force that is holding the second 114 to the driving rod.

Figure 5:
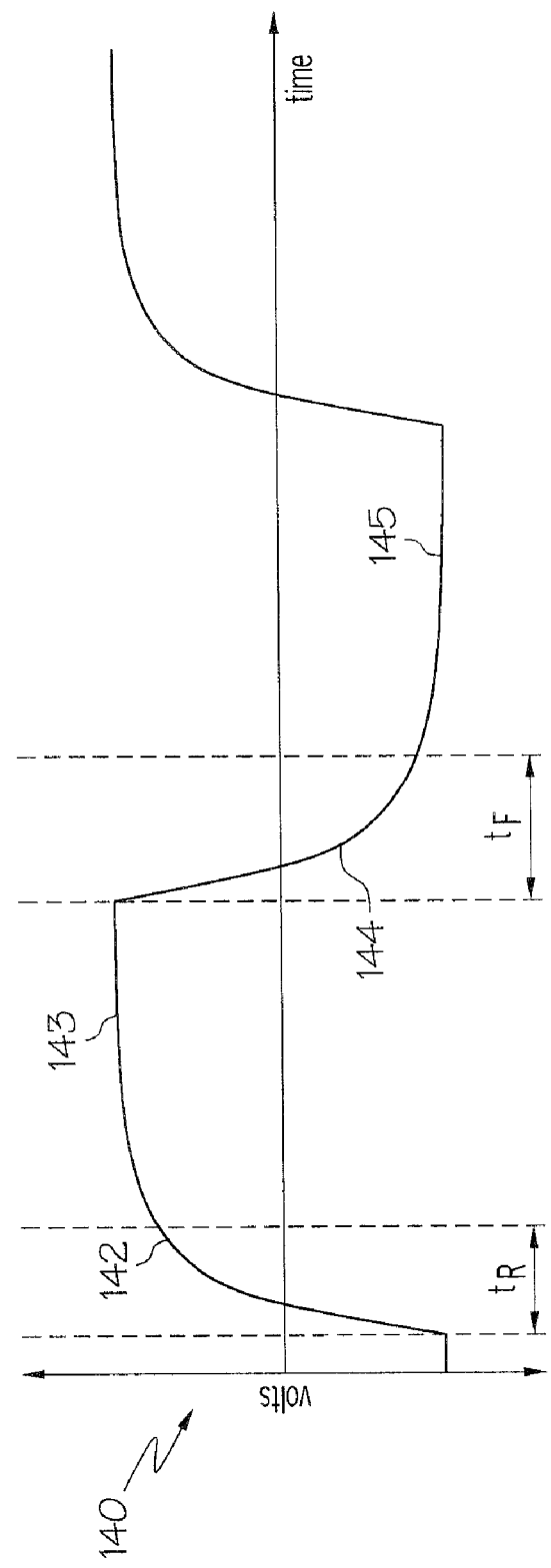
FIG. 5 depicts an exemplary dither waveform according to one or more embodiments.

Embodiments disclosed herein apply a dither waveform having slow rising and falling edge times to remove high frequency content from the dither waveform and prevent the object from slipping during the dither operation. FIG. 5 illustrates an exemplary dither waveform 140 of one embodiment. The dither waveform 140 comprises voltage pulses 143 having a rising edge 142 and a falling edge 144 that provides for a rising rise edge time $t_R$ and a falling edge time $t_R$, respectively, that are longer than the corresponding rising and falling times of the voltage pulses of the conventional dither waveform. In 136. The relatively slow rising edge time $t_R$ and falling edge time $t_F$ provides for a dither waveform without high frequency content to effectively oscillate the adaptive optics about an average position with relatively little slippage.

To achieve the slow rising and falling times of the dither waveform 140, the control circuit producing the waveform may include an increased impedance to slow the rising and falling edges. From an electrical drive standpoint, the piezo element of the SIDM behaves as a capacitor, and the rising and falling edge times are determined by an RC constant (piezo capacitance C times circuit series resistance provided by the control circuit). Therefore, to increase the rising and falling edge times, a series resistive element having an increased resistance value may be used to apply the dither waveform to the drive mechanism.

Figure 6:
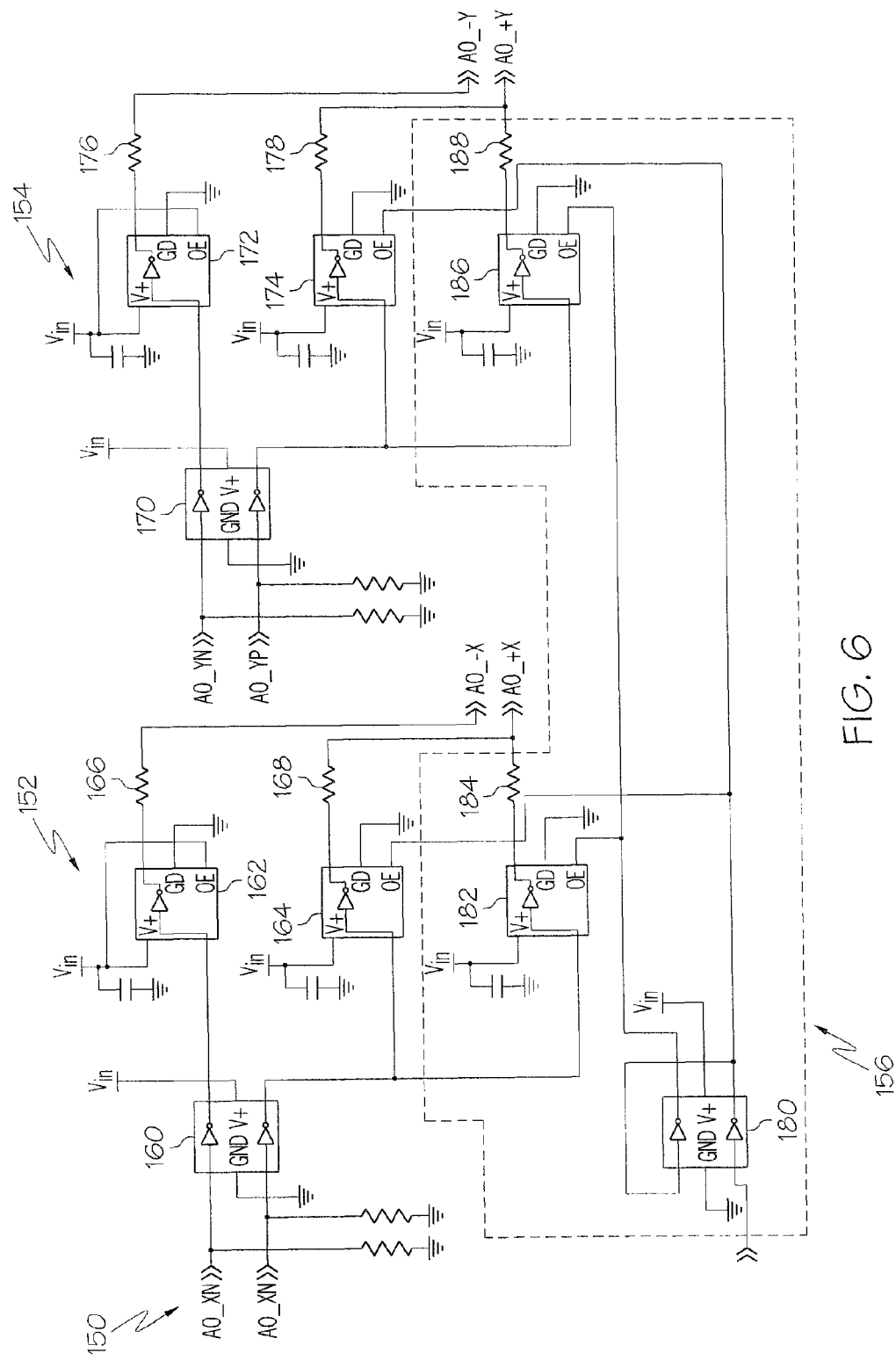
FIG. 6 depicts an exemplary control circuit according to one or more embodiments.

FIG. 6 illustrates an exemplary control circuit 150 of one embodiment that may be used to generate the advancement and dither waveforms described herein. The illustrated control circuit 150 may be used to control a drive mechanism having two SIDMs (x-axis SIDM and y-axis SIDM). It will be understood that more or fewer SIDMs may be controlled using circuits similar to the circuit illustrated in FIG. 6. The control circuit 150 may be incorporated into the package controller 124 along with other control electronics and control algorithms. Generally, the control circuit 150 comprises an x-axis inverter 160 and H-bridge 152, a y-axis inverter 170 and H-bridge 154, and a dither control circuit 156. The x-axis and y-axis H-bridges 152 and 154 comprise first and second x-axis continuous drivers 162 and 164 and first and second y-axis continuous drivers 172 and 174, respectively. Any high current driver capable of tri-stating its output may be used. Four transistors or MOSFETs may also be used to provide an H-bridge for each SIDM.

The x-axis inverter 160 receives positive and negative x-axis control signals AO_XP and AO_XN and passes said signals to the x-axis H-bridge 152, which may be used to apply the advancement waveform to the x-axis SIDM. One output of the x-axis inverter 160 is electrically coupled to continuous driver 164 (i.e., a first half-bridge) while the other output is electrically coupled to continuous driver 162 (i.e., a second half-bridge). Similarly, the y-axis inverter 170 receives and passes positive and negative y-axis control signals AO_YP and AO_YN to the y-axis H-bridge 154, which may be used to apply the advancement waveform to the y-axis SIDM. One output of the y-axis inverter 170 is electrically coupled to continuous driver 174 (i.e., a first half-bridge) while the other output is electrically coupled to continuous driver 172 (i.e., a second half-bridge). The output of each of the continuous drivers 162, 164, 172 and 174 is electrically coupled to a first resistive element having a first resistance value (first resistive elements 166, 168, 176 and 178). For example, the resistance value of the first resistive element may be a relatively small value (e.g., one ohm) to produce fast rising and falling edges. The other end of the first resistive elements 166, 168, 176 and 178 are electrically coupled to input leads of the x and y axis SIDMs (via connections AO_−X, AO_+X, AO_−Y, and AO_+Y, for example). The resistive elements described herein may be a resistor or another element or elements of the control circuit that may provide a resistance.

The exemplary dither control circuit 156 of FIG. 6 comprises a dither control gate 180, an x-axis dither half-bridge 182 and an y-axis dither half-bridge 184. The x-axis dither half-bridge 182 and the y-axis dither half-bridge 184 are electrically coupled to a second resistive element (e.g., second resistive elements 184 and 186) having a second resistance value that is greater than the first resistance value. For example, the second resistance value may be 100 ohms. The larger impedance provided by the second resistive element slows the rising and falling edge times of the dither waveform. The other end of the second resistive element is electrically coupled to the positive leads of the x and y axis SIDMs (AO_+X and AO_+Y).

The dither control circuit may be selectively used to only slow the rising and falling edge times of the dither waveform while maintaining the fast rising and falling edge times of the advancement waveform. The dither control gate may comprise a first input in which a dither control signal DitherSel may be applied. A first output of the dither control gate 180 is connected to an enable pin of the second continuous drivers 164 and 174 and a second input of the dither control gate 180. The second input generates an output signal at a second output that is an inverse of the output signal provided at the first output. The second output is connected to an enable pin of dither half-bridges 182 and 186.

Referring to the x-axis H-bridge 152 of FIG. 6 as an example, the first and second continuous drivers 162 and 164 (i.e., first and second half-bridges) and corresponding first and resistive elements 166 and 168 may be used to apply the fast edge advancement waveform. During the advancement waveform, the dither control circuit 156 is disabled such that the advancement waveform has fast rising and falling edge times.

During the dither operation, the dither control signal DitherSel is applied to the dither control gate 180, which produces an output signal at the first output that disables second continuous driver 164. Because the second output signal is the inverse of the first output signal, the second output signal enables the dither half-bridge 182. Therefore, the dither control circuit 156 removes the low resistance value (e.g., first resistive element 168) from the circuit 150 and replaces it with the higher resistance value (e.g., second resistive element 184) during the dither operation. During the advancement operation, the dither half-bridge 182 and second resistive element 184 are disabled such that the advancement waveform that is produced has fast rising and falling edge times. In this manner, the rising and falling edge times may be selectively controlled depending on the desired operation of the drive mechanism.

Circuits other than the exemplary circuit 150 of FIG. 6 may be utilized to provide a dither waveform having slower rising and falling edge times than the rising and falling edge times of the advancement waveform.

As described above, fast rising and falling edges contain high frequency content and may cause an object such as a lens of an adaptive optics assembly to slip on the driving rod of a SIDM. If present in a dither waveform, these fast edges may undesirably move the object rather than oscillating it back and forth about an average position. The movement may cause the closed loop control to react slowly, take many more steps than needed, and be unable to track temperature changes.

Figure 7:
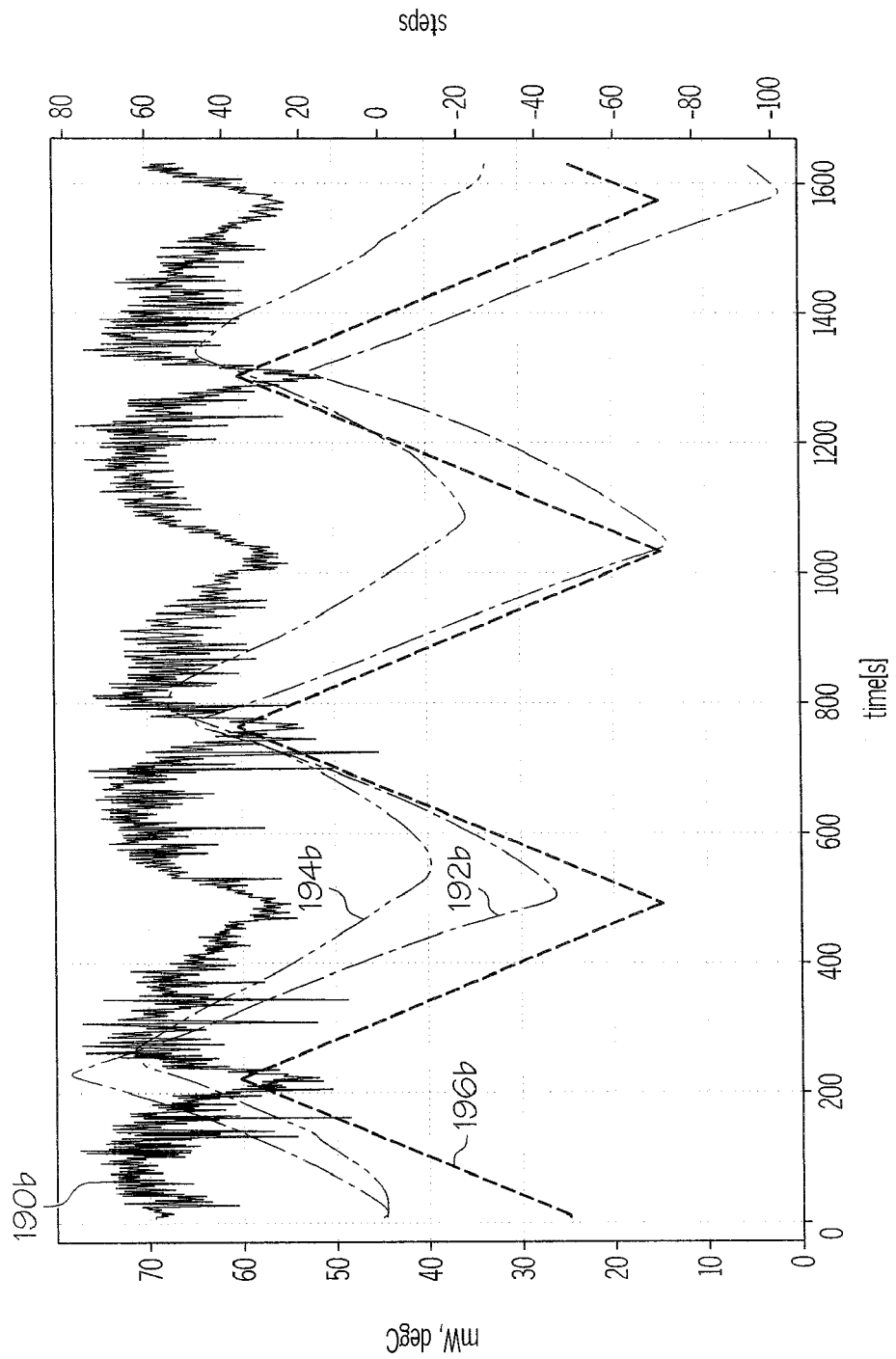
FIG. 7 depicts a graph of output power, x-axis SIDM steps, y-axis SIDM steps, and temperature of an optical package when a dither waveform according to one or more embodiments is applied to a drive mechanism having an x-axis SIDM and a y-axis SIDM.

FIG. 7 is a graph that plots an output power 190a of a wavelength conversion device in an optical package, a number of steps undertaken by an x-axis SIDM 194a and a y-axis SIDM 192a of a drive mechanism coupled to a lens 114, and temperature changes 196a over time with a dither waveform having slow rising and falling edge times produced by the exemplary control circuit illustrated in FIG. 6. The output power 190b provided by this dither waveform is significantly more constant (between 55 mW and 75 mW) than the output power 190a provided by the conventional waveform. The output power 190b does not have a significant drop as the temperature ramps down to 15° C. Additionally, the y-axis SIDM 192a and the x-axis SIDM 194a make a consistent number of steps to maintain the output power 190b as the temperature is cycled.

Embodiments described herein may be utilized to oscillate an object such as a lens of an adaptive optics with a SIDM without net motion of the object. The dither waveforms of embodiments described herein have rising and falling edge times that are greater than rising and falling edge times of an advancement waveform such that the object does not slip during the dither operation. This may allow the SIDM to make fewer overall steps during its life and, when incorporated in an optical package such as a green laser device, allows for better temperature tracking in a closed loop operation. Embodiments also provide an increased magnitude of dither displacement, which may allow for the closed loop control to operate more reliably.

For the purposes of describing and defining the present invention it is noted that the terms "about," "approximately," "substantially" are utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

It is noted that recitations herein of a component of the present invention being "configured" or "operable" in a particular way, "configured" or "operable" to embody a particular property, or function in a particular manner, are structural recitations as opposed to recitations of intended use. More specifically, the references herein to the manner in which a component is "configured" or "operable" denotes an existing physical condition of the component and, as such, is to be taken as a definite recitation of the structural characteristics of the component.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method for aligning an optical package comprising a semiconductor laser operable to emit an output beam with a first wavelength, a wavelength conversion device operable to convert the output beam to a second wavelength, adaptive optics configured to optically couple the output beam into a waveguide portion of an input facet of the wavelength conversion device, a control circuit comprising a first resistive element and a second resistive element, and a drive mechanism coupled to the adaptive optics and configured to adjust a position of the output beam on the input facet, the method comprising:
    applying an advancement waveform to the drive mechanism using the first resistive element to perform an advancement operation during which the drive mechanism advances the adaptive optics in an adjustment direction; and
    applying a dither waveform to the drive mechanism using the second resistance element to perform a dither operation during which the drive mechanism oscillates the adaptive optics back and forth in first and second directions to oscillate a position of the output beam on the input facet;
    wherein a polarity of the advancement waveform corresponds with the adjustment direction, and the first and second resistive elements are such that a rising edge time and a falling edge time of the dither waveform is greater than a rising edge time and a falling edge time of the advancement waveform.

2. A method as claimed in claim 1 wherein the rising and falling edge times of the dither waveform are such that a net motion of the adaptive optics is substantially zero during the dither operation.

3. A method as claimed in claim 2 wherein the rising and falling edge times of the dither waveform are up to ten percent of a total pulse duration.

4. A method as claimed in claim 3 wherein the dither waveform has a frequency of less than 300 Hz.

5. A method as claimed in claim 4 wherein the dither waveform has a duty cycle of about 50%.

6. A method as claimed in claim 1 wherein the rising and falling edge times of the advancement waveform are less than 200 ns.

7. A method as claimed in claim 6 wherein the advancement waveform has a frequency within the range of 300-400 kHz.

8. A method as claimed in claim 7 wherein the advancement waveform has a duty cycle of about 30%.

9. A method as claimed in claim 1 wherein the rising and falling edge times of the dither waveform are such that a magnitude of adaptive optics displacement is between about 10 nm and about 50 nm during the dither operation.

10. A method as claimed in claim 1 wherein a resistance of the first resistive element is greater than a resistance of the second resistive element.

11. A method as claimed in claim 1 wherein the first resistive element is approximately 100 ohms and the second resistive element is approximately 1 ohm.

12. A method as claimed in claim 1 wherein the optical package further comprises a package controller and the dither and advancement waveforms are applied using the package controller.

13. A method as claimed in claim 12 wherein:
    the drive mechanism comprises a first lead and a second lead;
    the control circuit comprises a dither control circuit and an H-bridge having a first side coupled to the first lead and a second side coupled to the second lead;
    the dither control circuit is coupled to the first lead of the drive mechanism;
    the H-bridge is operable to apply the dither and advancement waveforms to the first and second leads of the drive mechanism, respectively; and
    the package controller enables the dither control circuit to slow the rising and falling edges of the advancement waveform during the dither operation.

14. A method as claimed in claim 13 wherein:
    the first and second side of the H-bridge each comprises the first resistive element;
    the dither control circuit comprises a dither control gate and a dither half-bridge comprising the second resistive element; and
    the dither control gate is operable to disable the first side of the H-bridge and enable the dither half-bridge during the dither operation in accordance with a dither select signal provided by the package controller such that the second resistive element is applied to the first lead of the smooth impact drive mechanism.

15. A method as claimed in claim 1 wherein:
    the method further comprises measuring a power of light exiting the wavelength conversion device as the adaptive optics oscillate during the dither operation to determine the adjustment direction; and
    the adjustment direction corresponds with a direction of oscillation yielding an increased power measurement.

16. A method as claimed in claim 1 wherein the adaptive optics comprises a lens.

17. A control circuit for aligning an optical package comprising a semiconductor laser operable to emit an output beam with a first wavelength, a wavelength conversion device operable to convert the output beam to a second wavelength, adaptive optics configured to optically couple the output beam into a waveguide portion of an input facet of the wavelength conversion device, a first resistive element, a second resistive element, and a drive mechanism coupled to the adaptive optics and configured to adjust a position of the output beam on the input facet, wherein the control circuit is electrically coupled to the drive mechanism and is operable to:

apply an advancement waveform to the drive mechanism using the first resistive element to perform an advancement operation during which the drive mechanism advances the adaptive optics in an adjustment direction; and apply a dither waveform to the drive mechanism using the second resistive element to perform a dither operation during which the drive mechanism oscillates the adaptive optics back and forth in first and second directions to oscillate a position of the output beam on the input facet;

wherein a polarity of the advancement waveform corresponds with the adjustment direction and the first and second resistive elements are such that a rising edge time and a falling edge time of the dither waveform is greater than a rising edge time and a falling edge time of the advancement waveform.

18. A method for controlling a drive mechanism coupled to an object, the method comprising:

applying an advancement waveform to the drive mechanism using a first resistive element of a control circuit to perform an advancement operation during which the drive mechanism advances the adaptive optics in an adjustment direction; and applying a dither waveform to the drive mechanism using a second resistive element of the control circuit to perform a dither operation during which the drive mechanism oscillates the adaptive optics back and forth in first and second directions to oscillate a position of the output beam on the input facet;

wherein a polarity of the advancement waveform corresponds with the adjustment direction, and the first and second resistive elements are such that a rising edge time and a falling edge time of the dither waveform is greater than a rising edge time and a falling edge time of the advancement waveform.

19. A method as claimed in claim 18 wherein:

the object comprises adaptive optics within an optical package further comprising a semiconductor laser operable to emit an output beam with a first wavelength and a wavelength conversion device operable to convert the output beam to a second wavelength;

the adaptive optics is configured to optically couple the output beam into a waveguide portion of an input facet of the wavelength conversion device; and the drive mechanism is configured to adjust a position of the output beam on the input facet.

\* \* \* \* \*